(12) United States Patent
Givargizov

(10) Patent No.: US 6,306,734 B1
(45) Date of Patent: Oct. 23, 2001

(54) METHOD AND APPARATUS FOR GROWING ORIENTED WHISKER ARRAYS

(76) Inventor: Evgeny Invievich Givargizov, Obrucheva 20, Kv. 12, Moscow 117421 (RU)

( * ) Notice: Subject to any disclaimer, the term of this patent is extended or adjusted under 35 U.S.C. 154(b) by 0 days.

(21) Appl. No.: 09/155,815
(22) PCT Filed: Mar. 24, 1997
(86) PCT No.: PCT/RU97/00078
  § 371 Date: Dec. 21, 1998
  § 102(e) Date: Dec. 21, 1998
(87) PCT Pub. No.: WO97/37064
  PCT Pub. Date: Oct. 9, 1997

(30) Foreign Application Priority Data

Apr. 1, 1996 (WO) .................. PCT/RU96/106224

(51) Int. Cl.$^7$ .................. C30B 20/21; H01L 20/21
(52) U.S. Cl. .................. 438/478; 438/30; 438/48; 438/497; 438/503; 257/72; 349/1; 349/42; 349/43
(58) Field of Search .................. 438/497, 503, 438/478, 30, 48; 257/72; 349/1, 42, 43

(56) References Cited

U.S. PATENT DOCUMENTS

| | | | |
|---|---|---|---|
| 3,536,538 | 10/1970 | Wagner | 148/1.6 |
| 5,314,569 | * 5/1994 | Pribat et al. | 117/75 |
| 5,362,972 | * 11/1994 | Yazawa et al. | 257/13 |
| 5,726,524 | * 3/1998 | Debe | 313/309 |

FOREIGN PATENT DOCUMENTS

| | | |
|---|---|---|
| 0 443 920 A | 8/1991 | (EP) . |
| 0 452 950 A | 10/1991 | (EP) . |
| 0 568 316 A | 11/1993 | (EP) . |
| 1 533 645 | 11/1976 | (GB) . |
| 1 533 645 A | 11/1978 | (GB) . |
| WO-97/37064 | * 3/1997 | (RU) .................. C30B/11/12 |

OTHER PUBLICATIONS

Yazawa et al. "Heteroepitaxial ultrafine wire–like growth of InAs on GaAs substrates" Appl. Phys. Lett. vol. 58 Mar. 11, 1991 No. 10 pg. 1080–1082.*
F.H. Nicoll; Journal of the Electrochemical Society; vol. 110, No. 11; The Use of Close Spacing in Chemical–Transport Systems for Growing Epitaxial layers of Semiconductors;pp. 1165–1167; Nov. 1963.
Wagner, R.S., et al; Applied Physics Letters; vol.4, No. 5; Vapor–liquid–Solid Mechanism of Single Crystal Growth;pp. 89–90; Mar. 1, 1964.
James, D.W.F., et al; Brit. J. Appl.Phys.; 1965, vol. 16; Silicon whisker growth and epitaxy by the vapour–liquid–solid mechanism; pp. 1089–1094.
Okajima, Yoshihiko, et al; Journal of Crystal Growth 141 (1994) 357–362; Precise control of growth site of silicon vapor–liquid–solid crystals.

* cited by examiner

Primary Examiner—Matthew Smith
Assistant Examiner—Granvill D Lee
(74) Attorney, Agent, or Firm—Knobbe Martens; Olson & Bear, LLP

(57) ABSTRACT

A method for growing of oriented whisker arrays on a single-crystalline substrate consists in vapor-phase transport of the material to be crystallized form a solid-state source body of the same composition as the whiskers to the substrate coated with liquid-phase particles that serve as nucleation/catalyzing centers for the whisker growth. The source body has a plane surface that is faced to the substrate and parallel to it so that a vectorly-uniform temperature field, whose gradient is perpendicular to both the substrate and the source, is created. The vectorly-uniform temperature field is realized by an apparatus with high-frequency heating of specially designed bodies that are arranged in a special position in respect to the high-frequency inductor. Laser and/or lamp heat sources can be also used either separately or in combinations with the high-frequency heater. In the apparatus, the material source is heated, while the substrate takes heat from the material source. In another case, the substrate is heated, while the material source takes heat from the substrate.

13 Claims, 6 Drawing Sheets

METHOD AND APPARATUS FOR GROWING ORIENTED WHISKER ARRAYS

FIELD OF THE INVENTION

This invention relates to electron materials science and to microelectronics, including vacuum microelectronics, in particular to preparation and fabrication of devices based on field electron emission such as matrix field-emission cathodes, field-emission displays, microwave devices, various electron guns, etc.

BACKGROUND OF THE INVENTION

Field emission is usually realized from sharp tips having radii of curvature in the range of micrometers and nanometers. There are several methods for their preparation.

One of them consists in growing of oriented, mutually parallel whiskers on a substrate and, then, sharp tips are prepared from the whiskers by various treatments.

To this aim, chemical vapor deposition of crystals, including chemical transport of substances, is most suitable. It is known a method for crystallization of materials in a narrow space [1]. However, this method is not effective for growing of oriented whisker arrays, because it does not ensure nucleation and growth of whiskers at particular points of substrates.

It is known a method for growing of oriented whisker arrays on a single-crystalline substrate oriented along the most-close-packed crystallographic face of a given material by vapor phase deposition, at heating, via solvent (liquid-forming) particles orderly deposited on the substrate [2]. This method is based on the vapor-liquid-solid (VLS) growth mechanism proposed by the same author [3]. However, the method and apparatus patented and described for its realization suffer from the fact that the grown whiskers are often branching, kinking, etc.

In the scopes of the mentioned method for whisker growing, a procedure for creation of localized (e.g., micron-sized) solvent particles is important. For growing of, e.g., silicon whiskers, metals, such as gold, copper, nickel, etc, are used as solvents.

One of the technique for preparation of the localized particles consists in evaporation of the metals through a template mask. However, such a technique is unsuitable for localization of the particles on large-area substrates (for example, $cm^2$ or more), because, in such a case, it is impossible to ensure a uniform clasp of the template to the substrate. On this reason, the metal particles formed are not clear-cut, have different sizes, etc.

More suitable for this is a photolithographic process. Such a process, as applied to whisker growth, is described in [4]. This method, however, gives a poorly-reproducible results because the solvent used (e.g., gold) contacts with the photoresist at a preliminary stage of the procedure resulting in a non-controlled, non-oriented growth of whiskers.

Another photolithographic method for localization of the solvent is described in [5]. There, the solvent (gold) is deposited inside an oxide mask formed on silicon substrate. However, the method suffers from the fact that the liquid alloy (silicon-gold in this case) is spreading, at high temperature, along the substrate-oxide interface, "explodes" the oxide and, accordingly, an ordered whisker growth is destroyed.

It is known an apparatus for growing of oriented whisker arrays that consists of a tube reactor with a gas-mixture that flows through the reactor evolving the crystallized material, of an axis-symmetric substrate holder and a heating source [6]. The apparatus, however, has a figured shape heater with cavities for placing of the substrates. Such a heater does not allow to reach an ordered, uniform, perfect growth of whiskers on large areas due to fluctuations of the gas streams, a non-uniform temperature gradients, etc.

Tasks of this invention are the following:

(1) A method for controlled growing of whiskers on a substrate that allows to prepare regular arrays of well-oriented whisker arrays on a large area. This method must also include techniques for deposition of arrays of localized solvent particles on the substrate.

(2) Apparatus for realization of the method for controlled growing of the whisker arrays on a substrate that pprovides preparation of such arrays uniform on large areas.

DISCLOSURE OF THE INVENTION

The tasks indicated are realized in this method by growing of the oriented whisker arrays, preferentially for field electron emitters, on a single-crystalline substrate, oriented along the most-close-packed crystallographic plane of a given material, by vapor-phase deposition at heating, via solvent particles deposited onto the substrate orderly, wherein in parallel to the substrate is placed a solid-state source of the material for whisker growth with a plane surface faced to the substrate, the solid-state material source having the same composition as the growing whiskers, so that a vectorly-uniform temperature field, whose gradient is perpendicular to both the substrate and the source, is created between the substrate and the source. The solvent particles are deposited onto the substrate by either evaporation through a template mask or by means of a photolithographic technique.

The temperature of the material source can be higher than the temperature of the substrate. At such a case, in the space between the source and the substrate, vacuum is created or an inert gas is introduced, and the material is transported from the source to the substrate by evaporation and condensation. At another case, the transport is ensured by introduction, in the space between the material source and the substrate, of a substance that reacts with them chemically.

The temperature of the material source can be lower than the temperature of the substrate. At such a case, in the space between the source and the substrate is introduced a substance that transport the material from the source to the substrate by means of a chemical reaction.

When the solvent particles are deposited by the photolithographic process, after creation of openings in the protection mask, hollows are formed in the substrate opposite to the openings. The diameter of the hollows exceeds the diameter of the openings, their depth is not less than 0.1 of the diameter of the openings, the solvent is deposited all over the substrate and is subsequently removed from all areas, except of the bottom of the openings.

The solvent deposited in the photolithographic process is removed from the surface of the protection mask either mechanically (by wiping) or chemically (by dissolution of the mask together with the solvent).

Silicon can be used as a material source and as a substrate, the latter should be a silicon wafer with the (111) crystallographic orientation. As a solvent, gold can be used, as an example. The whisker growing is performed at temperatures higher than 800° C. As a substance that transports the material source, a mixture of hydrogen and silicone tetrachloride is used.

The task of this invention consists also in an apparatus for growing of oriented whisker arrays. preferentially for field electron emitters, that consists of a tube reactor with flows of gaseous mixtures evolving the crystallizing material, of a substrate, an axis-symmetrical substrate holder, and a heat source. In the tube reactor, opposite to the substrate a material source is placed that takes a heat from the heat source, whereas the substrate is heated from the material source.

In another version of the apparatus for growing of oriented whisker arrays, in the tube reactor, opposite to the substrate, a material source is placed, the substrate taking the heat from the heat source, whereas the material source is heated from the substrate.

The heat source can be done as a high-frequency inductor. The inductor can have a cylindrical or conical shape. The material source is placed on a holder made as a truncated circular cone with bases perpendicular to its axis. Larger basis of the cone has a cylindrical continuation, and the material source is placed on this basis, whereas smaller basis of the conical holder of the material source has a protrusion (projection). The substrate, opposite to the material source, is placed on a holder that is made as a heat radiator with a plane surface adjoining to the substrate and that has heat-radiation protrusions on the opposite side of the substrate holder along the edges of the heat radiator.

In another version of a similar apparatus, a substrate holder is made as a truncated circular cone with bases perpendicular to its axis. Larger basis of the cone has a cylindrical continuation, and the substrate is placed on this basis, whereas smaller basis of the conical holder has a protrusion. The material source, opposite to the substrate, is placed on a holder that is made as a heat radiator with a plane surface adjoining to the material source and that has heat-radiation protrusions on the opposite side of the holder of the material source along the edges of the heat radiator.

In the above apparatus, the cone is arranged concentrically inside the inductor, a part of the cone being out of the inductor, with the larger basis outside. The distance from the larger basis to the outside plane of the last coil of the inductor is 0.2 to 0.8 of the outside diameter of the inductor.

The angle of the cone is 15° to 120°, whereas the protrusion of the conical holder has a cylindrical shape with the ratio of its diameter and of its height to the larger basis of the cone lies in the range 0.1 to 0.5.

In another version of the apparatus for growing of the oriented whisker arrays, the heat source is placed inside of an axis-symmetrical hollow holder of the material source, the holder having prismatic or truncated-pyramidal outside surface. The material source takes heat from the surface of the prism or pyramid, whereas the substrate takes heat from the material source, and a heat leveller (homogenizer) is adjoining by its plane surface to the substrate.

In one more version of the apparatus, the heat source is placed inside of an axis-symmetrical hollow holder of the substrates, the holder having prismatic or truncated-pyramidal outside surface. The substrates take heat from the surface of the prism or pyramid, whereas the material source takes heat from the substrates, and a heat leveller is adjoining by its plane surface to the material source.

In the both latter versions of the apparatus, wall thickness of the holders is 0.05 to 0.2 of the outside diameter of the prism or truncated pyramid.

In other versions of the apparatus for growing of the oriented whisker arrays, the heat source is made of lasers or lamps, or of their combinations, including combinations with high-frequency inductors.

1- the high-frequency inductor coil (heat source);
2- the heated body (the holder of the material source);
3- the material source;
4- the substrate;
5- the radiator (the holder of the substrate);
6- the force lines of the electromagnetic high-frequency field;
   $d_1$ - the distance from the larger basis of the cone to the outside plane of the last coil of the inductor;
   $d_2$ - the diameter of the protrusion (projection) on the heated body;
   $h_1$ - the height of the protrusion on the heated body;
   $h_2$ - height of the cylindrical continuation of the cone;
   - cone angle.

Figure 3:
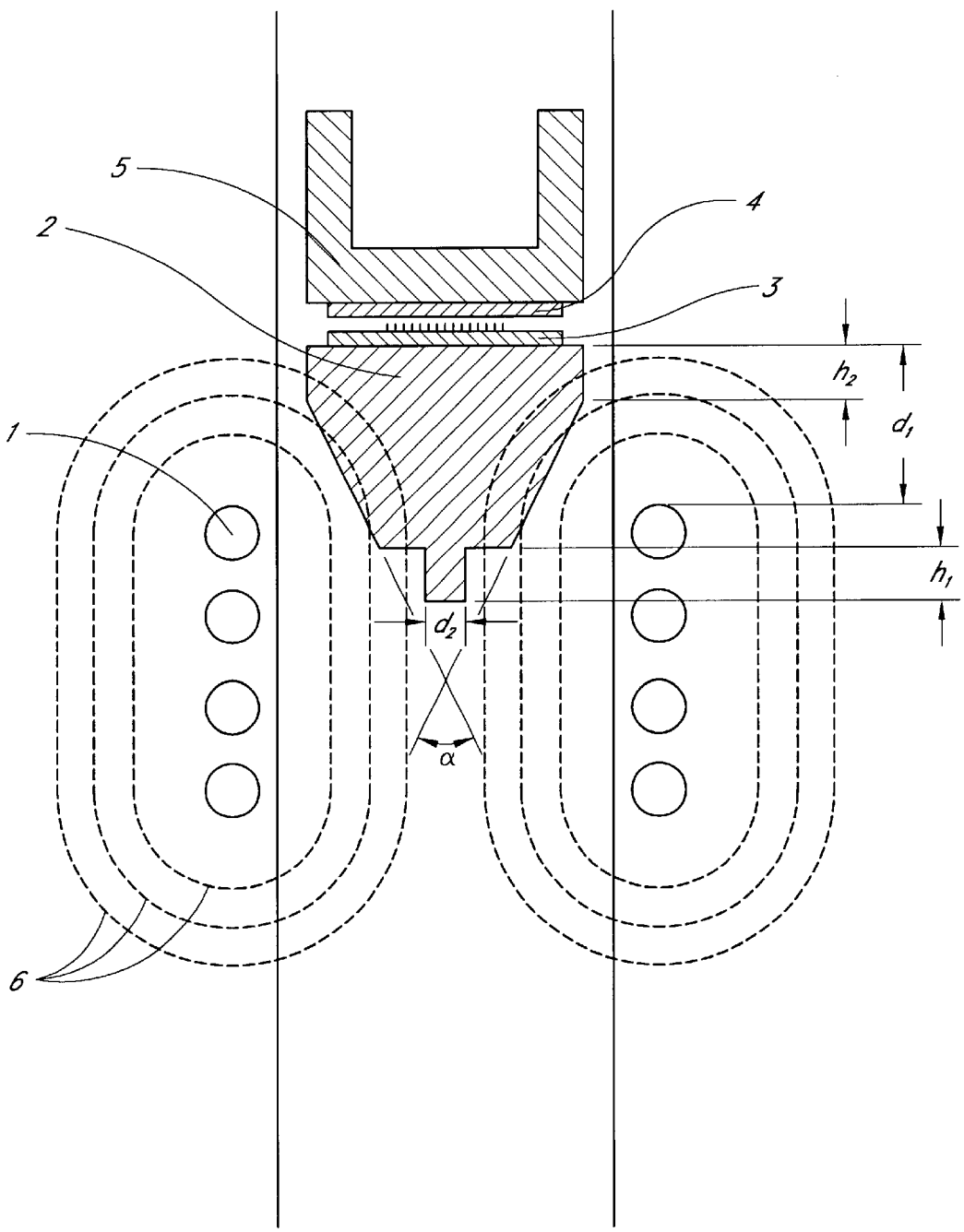

FIG. 3. An arrangement of the heated body and high frequency inductor in the version when a substance is transported from a less heated to a more heated body.

Figure 4:
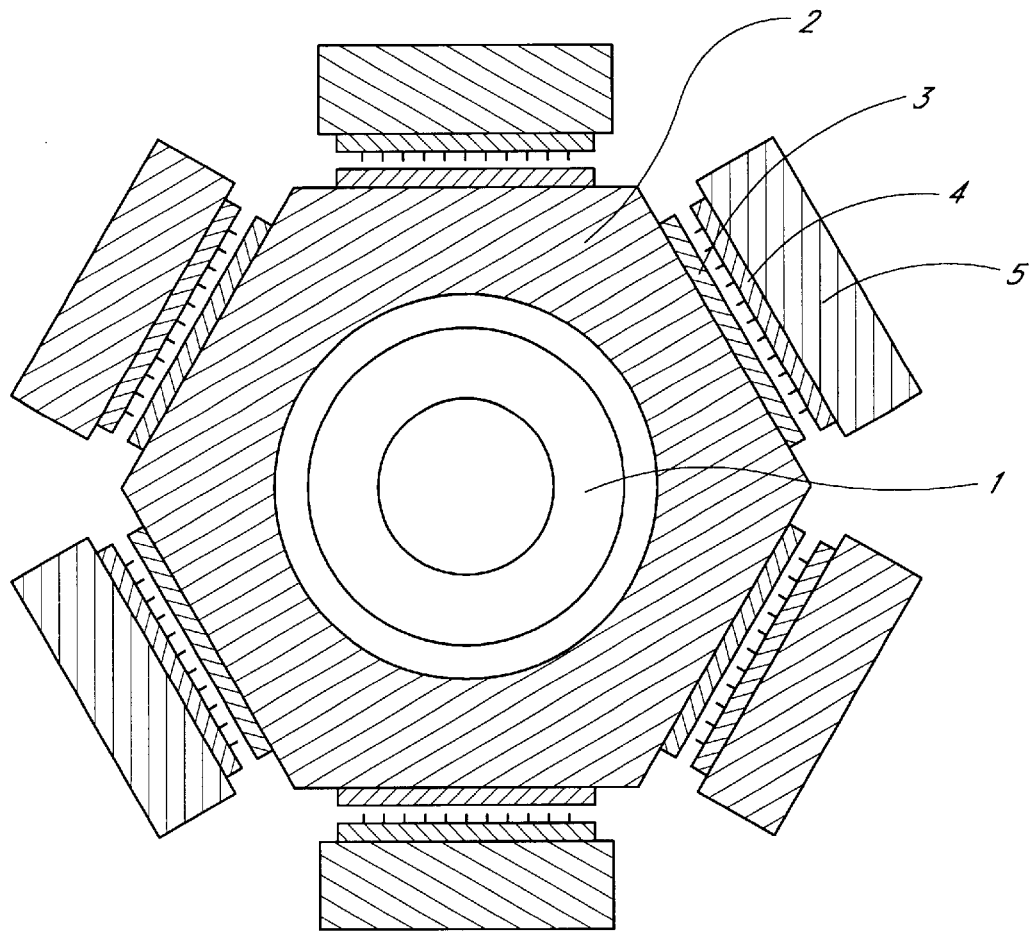

FIG. 4. An arrangement of the internal cylindrical or conical inductor in a hollow prismatic or pyramidal heated body in the version when a substance is transported from a more heated to a less heated body. All designations as in FIG. 2; here 5 is a leveller of temperature.

Figure 5:
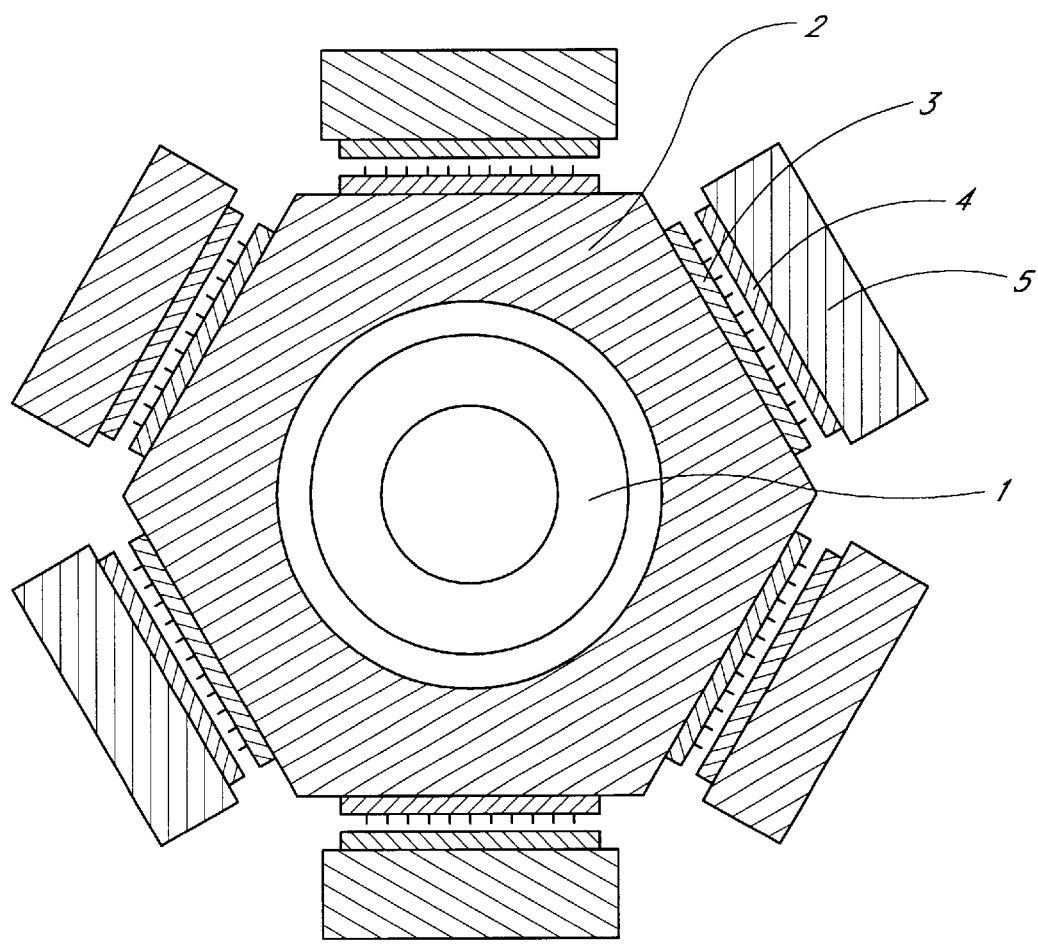

FIG. 5. An arrangement of a similar heating system in the version when a substance is transported from a less heated to a more heated body. All designations as in FIG. 3; here 5 is a leveller of temperature.

FIG. 6. A scheme of successive operations in preparation of a substrate for whisker growth, and growing of the whiskers.

BEST VERSION OF REALIZATION OF THE INVENTION

Figure 1:
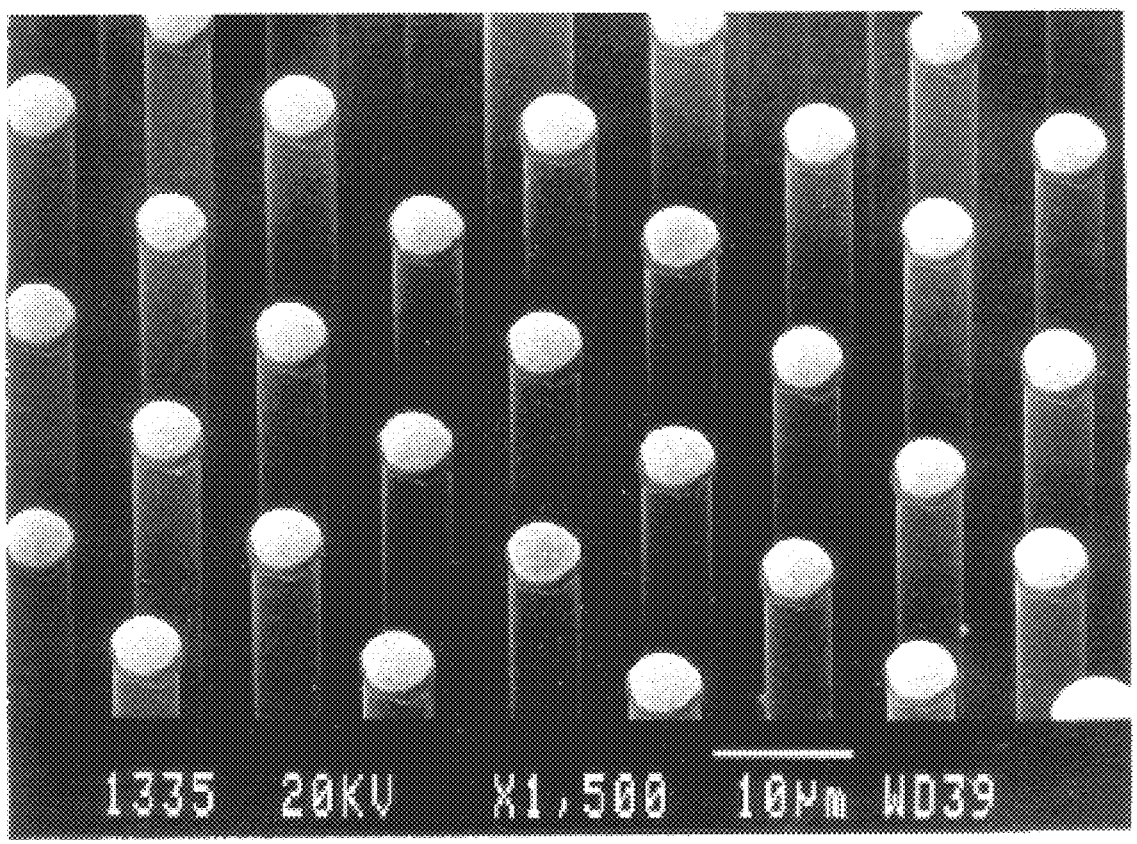
FIG. 1. An oriented array of silicon whiskers grown according to the vapor-liquid-solid mechanism. The photo was obtained in scanning electron microscope.

In FIG. 1 is shown an oriented array of silicon whiskers grown on (111) silicon substrate according to the invention method at substrate temperature 950° C. by means of the reaction $$SiCl_4 + Si = 2SiCl_2 \qquad (1)$$

where silicon interacts with its own tetrachloride.

As a liquid-forming agent (solvent) here gold is used. Globules are seen on apices of the whiskers—the globules consist of mixtures of silicon and gold crystallites. An advantage of gold in this process consists in the fact that this metal is chemically passive and, accordingly, it does not form stable compounds with the crystalized material. One more advantage of the solvent consists in that, at typical crystallization temperatures of silicon whiskers with participation of its tetrachloride, solubility of the material in gold is rather high, about 50%. Owing to this, a range of acceptable crystallization supersaturations is broad and, on this reason, the process of ordered, oriented crystallization depends weakly on variations/fluctuations of the process parameters. On the silicon wafer/substrate with the crystallographic orientation (111), is created a regular array of gold particles of such sizes that, after their contact melting with the silicon substrate at a temperature about 1000° C., silicon-gold droplets with sizes, for example, 2–5 um, partly immersed into the substrate, are formed.

The crystallization process is performed in the flow of purified hydrogen, at the atmospheric pressure. After a heating, when a thermal equilibrium is established in the system, vapors of silicon tetrachloride are added to the hydrogen flow so that the concentration of the $SiCl_4/H_2$ mixture becomes several percents. At stationary conditions, the equilibrium of the reaction (1) is established at relatively high temperature of the material source. Then, the reagents formed are transported, by means of gaseous diffusion, in the narrow space between the source and the substrate, to the substrate that has a lower temperature. Here, a new equilibrium of the reaction (1) is established, and an excess of silicon formed is evolved on the surface of the substrate, while another product of the reaction, $SiCl_4$, returns to the material source, and the process is repeated.

It is important for the process of growing of whiskers that, owing to an extremely high adsorption ability of the liquid phase in respect to chemical reagents, the reaction with silicon evolution proceeds preferentially on the surface of the droplets. In such a way, the Si-Au droplet becomes supersaturated in respect to silicon, the excess of the material diffuses to the bottom of the droplet and is deposited there epitaxially at the liquid-solid interface, i.e., is incorporated into silicon. As the crystalline material is deposited, the droplet is pushed out of the substrate, and a columnar crystal (whisker) is formed. The direction of the whisker is perpendicular to the most-close-packed face of silicon, i.e., it has orientation [111], the diameter of the whisker is determined by the sizes of the droplet, while its height is determined by duration of the growth process and by the growth rate.

It is important that the direction of the whisker growth coincides with the direction of the material feeding. In such a way, a homogeneity of the growth condition for various whiskers is ensured on a large surface area of the substrate.

In the case under consideration, the material source and the substrate have, as a rule, cantimeter sizes, while the distance between them are in the range of tenths of millimeter. Accordingly, boundary conditions does not practically influence the crystallization process. The small distance between the material source and the substrate ensures a strict perpendicularity of the temperature gradient to the source and to the substrate (in this case, the perpendicularity in respect to the substrate, where the crystallization process takes really place, is especialy important).

Under favourable—homogeneous, stable—growth conditions, all the grown whiskers are identically oriented, i.e., are mutually parallel. Such conditions can be ensured if the temperature field is vectorly-uniform, i.e., when isotherms are parallel to the substrate or, in other words, when they are perpendicular to the growth direction of whiskers. This is ensured by the method and apparatus considered in the patent.

In this invention, such crystallization conditions are ensured, best of all, by a special arrangement (configuration) of the apparatus where an optimal temperature field, that gives a homogeneous feeding of the growing crystals, is created owing to one-side (unilateral) heating of the material source (then, the substrate is heated from it, for example, by radiation or heat-conductivity), or of the substrate (then, the material source is heated from the substrate).

Owing to such a configuration, it is very important that virtual changes of the heating power, that could influence the whisker growth, are levelling by the fact that temperatures of both the material source and the substrate are changing sinchroniously. This stabilizes automatically the crystallization conditions.

In FIG. 1 is shown an oriented whisker array that was grown according to the method and by means of the apparatus described in this invention.

Figure 2:
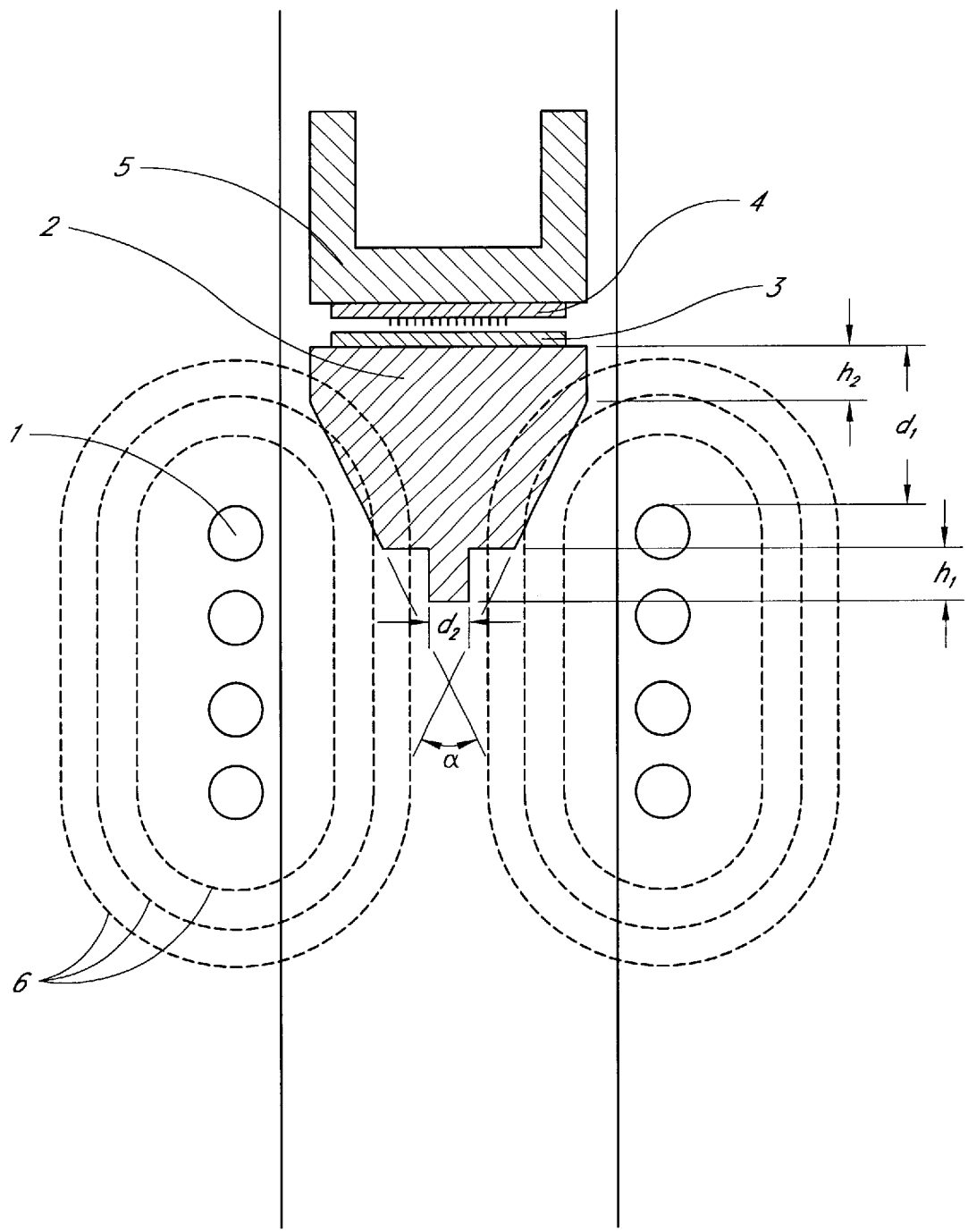
FIG. 2. An arrangement of the heated body and high frequency inductor in the version when a substance is transported from a more heated to a less heated body.

In FIG. 2, the apparatus for growing of the whiskers with using of the high-frequency induction heating is shown. This version of the heating is one of the most suitable for the considered crystallization method. In such a case, an axis-symmetrical induction coil (inductor) 1 is used, and the heated body 2 (that serves also as a holder for the material source 3) is done also as an axis-symmetrical combination of (mainly) conical and cylindrical parts. In such an apparatus, the force lines of the electromagnetic field 6 are also axis-symmetrical. On the substrate 4, a radiator 5 for levelling of its temperature is placed.

In order to ensure a uniform heating of the source 3 (and from it - heating of the substrate 4, a silicon wafer oriented along the crystallographic plane (111)), this ensemble is place by a special manner: it is pushed out of the inductor for a distance $d_1$. At such a case, part of the power of the heating source is lost; however, in return, such a design ensures a uniform heating of the larger plane of the body 2, on which the material source is placed.

As an additional factor for levelling (uniformization) of the temperature on the larger plane, a protrusion with the diameter $d_2$ and height $h_1$ on the heated body is formed. Also, the cone angle is optimized (as a rule, it is about 60°). At the diameter of the larger (basis) plane, for example, 40 mm, the diameter $d_2$ about 10 mm, height $h_1$ about 20 mm, and the distance $d_1$ from the larger basis of the cone to the outside plane of the last coil of the inductor about 20 mm, the source 3 is heated sufficiently uniformly, e.g., to 1050° C. From the source, the substrate 4 is heated, also uniformly, to the temperature about 950° C. The uniformity is ensured, at the above indicated sizes, shapes, and arrangement of the heated body, owing to a so-called "skin effect" of the high-frequency heating (the induction currents flow preferentially along the surface—mainly conical one, in this case—of the body).

In the version of the chemical transport of a substance from a more heated to a less heated body, at the distance 0.3 to 0.7 mm between the low plane of the substrate 4 and the upper plane of the material source 3, at the concentration of $SiCl_4/H_2$ about 3%, during a period of time 1 hour, silicon whiskers with a height 50 to 100 micrometers are grown on the silicon substrate.

As 5 here is designated a radiator (fabricated, e.g., from graphite), intended for levelling of the substrate temperature, and as 6 are designated force lines of the electromagnetic field.

The same version of the apparatus is suitable for growing of whiskers without using of the chemical reactions namely, at a physical transport of substances, by means of evaporation/condensation processes. In such a case, vacuum or atmosphere of an inert gas are created in the crystallization chamber.

Another version of the apparatus for whisker growing by means of the induction heating with conical heater is given in FIG. 3. It is suitable for using in processes with the exothermic reactions when a substance is transported from a less heated to a more heated body. As examples are iodide reactions of disproportionation with deposition of refractory metals, such as titanium, zirconium, etc, or transport of tungsten in oxihalogenic media. In this case, also the axis-symmetric heating ensemble is used, and the temperature gradient is created by pushing out of the ensemble from the inductor.

One more version of the apparatus that gives the vectorly-uniform temperature field at using of the induction heating is given in FIGS. 4 and 5. Here, the inductor is introduced inside of a hollow heater fabricated, e.g., of graphite. At a sufficient thickness of the walls of the heater, the temperature of the external faces of the heater (serving also as a holder of the material source or of the substrate), that has a prismatic shape or a shape of a truncated pyramid, can be sufficiently homogeneous. In this version, a radiator adjoining to the material source or to the substrate serves as a leveller of the temperature, too.

One more version of the apparatus for creation of the vectorly-uniform temperature field consists in the following: a one-side heating of a body, that serves as a holder of the substrate, or of the material source, is ensured by a laser, e.g., a $CO_2$-laser. Such a laser has a high transformation coefficient of energy.

One more version of the apparatus for uniform one-side heating of the substrate or material source is based on using of lamps.

Finally, for preparation of oriented whisker array, uniform on large-area substrates, it is important to have reproducible substrates with arrays of solvent particles.

One of the versions of the method for preparation of such substrates is shown in FIG. 6.

Figure 6A:
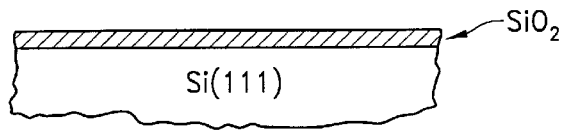
Figure 6B:
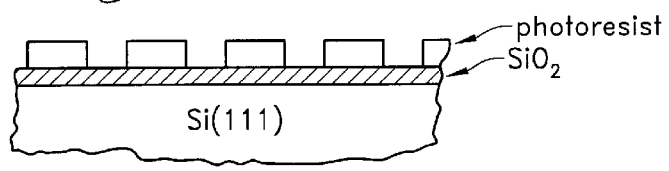
Figure 6C:
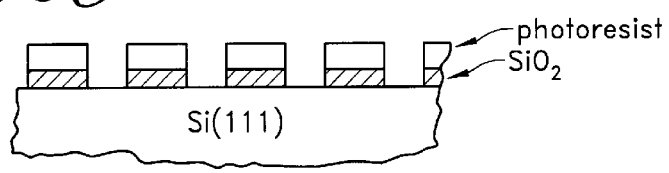
Figure 6D:
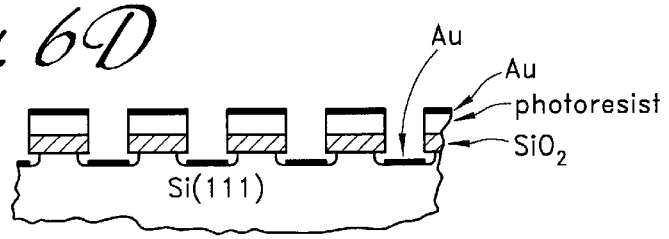
Figure 6E:
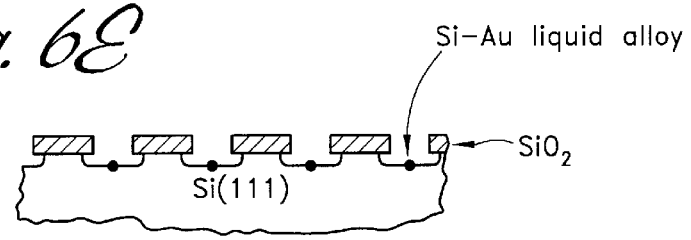
Figure 6F:
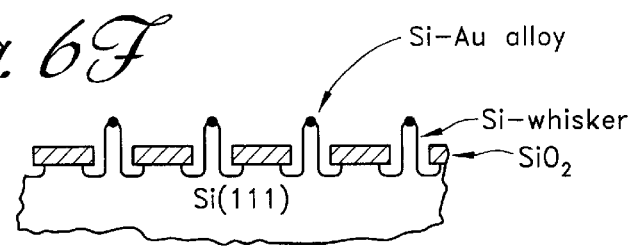

In a typical procedure, a photolithographic process is used to this aim. On a single-crystalline silicon substrate with the orientation (111), a protection mask, for example, of silicon oxide, about 0.5 micrometer in thickness, is created (FIG. 6a). On the surface of the oxidized substrate, a photoresist is deposited, and in the oxide layer circular openings of micrometer sizes, for example, 5 to 7 micrometer in diameter, are formed by means of the photolithography (FIGS. 6b,c). By means of a special silicon-dissolving etch that acts weakly on the oxide, against the openings in the protection mask hollows are created in the silicon substrate with the depth 2 micrometers. At the etching procedure, the hollows in the silicon are expanded symmetrically in all directions for about 2 micrometers. Owing to this, during evaporation of a metallic solvent edges of the protection mask prevent deposition of the metal on the silicon-oxide interface (see FIG. 6d). Accordingly, later on, at a contact melting of the solvent and at growing of the whiskers, it is possible to avoid a contact of the liquid alloy formed with the protection mask (FIG. 6e) and, in such a way, to ensure formation of uniform whisker arrays (FIG. 6f).

REFERENCES

1. F. N. Nicoll, J. Electrochem. Soc. 110, 1165 (1963).
2. R. S. Wagner, Crystal growth technique, U.S. Pat. No. 3,536,538 (1979)
3. R. S. Wagner and W. C. Ellis, Vapor-liquid-solid mechanism of single crystal growth, Appl. Phys. Lett. 4, 89–90 (1964).
4. Y. Okajima, S. Asai, Y. Terui, R. Terasaki, and H. Murata, Precise control of growth site of silicon vapor-liquid-solid crystals, J. Crystal Growth, 141, 357–362 (1994).
5. D. Pribat, P. Leclerc, P. Legagneux, and Chr. Collet, Procede de croissance controlee de cristaux aciculaires et application a la realisation de microcathodes a pointes, Fr. Demande de Brevet 2.658.839 (1990).
6. D. W. F. James and C. Lewis, Silicon whisker growth and epitaxy by vapour-liquid-solid mechanism, Brit. J. Appl. Phys. 16, 1089–1094 (1965).

What is claimed is:

1. A method for growing oriented whisker arrays, preferentially for field-electron emitters, on single-crystalline substrates oriented along a most-closely-packed crystallographic plane comprising:
   depositing solvent particles onto the substrate be either evaporation through a template mask or by means of a photolithographic process;
   placing a solid-state whisker source material with a planar configuration parallel to and having a surface facing the substrate; and
   providing a vectorly-uniform temperature field between the substrate and the source whose gradient is perpendicular to the substrate and to the source, thereby effecting vapor phase deposition of the source material to the solvent particles.

2. The method of claim 1 wherein the temperature of the material source is higher than the temperature of the substrate.

3. The method of claim 2 wherein in the space between the material source and the substrate vacuum is created or an inert gas is introduced, and the material is transported from the source to the substrate by evaporation and condensation.

4. The method of claim 2 wherein in the space between the material source and the substrate a substance is introduced that transports the material from the source to the substrate by means of a chemical reaction.

5. The method of claim 1 wherein the temperature of the material source is lower than the temperature of the substrate.

6. The method of claim 1 wherein, at deposition of the solvent particles by means of the photolithographic process, after creation of openings in the protection mask, hollows are created in the substrate against the openings, the diameter of the hollows exceeding the diameter of the openings in the masks, the depth of the hollows being more than 0.1 of the diameter of the openings, the solvent is deposited all over the substrate and, then, is removed from all the areas, except of bottom of the hollows.

7. The method of claim 6 wherein the solvent is removed from the surface of the protection mask mechanically.

8. The method of claim 6 wherein the solvent is removed from the surface of the protection mask chemically, by dissolving of the mask together with the solvent.

9. The method of claim 1 wherein silicon is used as the material source and the substrate, a (111)-oriented silicon wafer being used as the substrate.

10. The method of claim 9 wherein gold is used as the solvent.

11. The method of claim 10 wherein the growing of the whiskers is performed at a temperature higher than 800° C.

12. The method of claim 9 wherein a mixture of hydrogen and silicon tetrachloride is used for transporting of the material source.

13. A method for growing oriented whisker arrays comprising:
   creating a protection mask on a single crystalline substrate oriented along a most-closely-packed crystallographic plane;
   creating openings in the protection mask by means of a photolithographic process;
   creating hollows in the substrate at the openings, wherein the hollows in the substrate are expanded symmetrically in all directions, such that diameters of the hollows exceed diameters of the openings, and a depth of the hollows is more than 0.1 times the diameter of the openings;

depositing solvent particles onto the substrate orderly; and placing a solid-state source of whisker material having a planar configuration parallel to and facing the substrate providing a vectorly-uniform temperature field whose gradient is perpendicular to both the substrate and the solid-state source of whisker material so as to effect vapor phase deposition of the whisker material.

* * * * *

UNITED STATES PATENT AND TRADEMARK OFFICE
CERTIFICATE OF CORRECTION

PATENT NO. : 6,306,734 B1
DATED : October 23, 2001
INVENTOR(S) : Givargizov

It is certified that error appears in the above-identified patent and that said Letters Patent is hereby corrected as shown below:

<u>Title page, Item [54] and Column 1, line 1,</u>
Please delete the words "AND APPARATUS".

<u>Column 8,</u>
Line 6, please delete "substrate be" and replace with -- substrate by --.

Signed and Sealed this

Second Day of September, 2003

JAMES E. ROGAN
*Director of the United States Patent and Trademark Office*